United States Patent
Dent

(10) Patent No.: US 6,594,152 B2
(45) Date of Patent: *Jul. 15, 2003

(54) BOARD-TO-BOARD ELECTRICAL COUPLING WITH CONDUCTIVE BAND

(75) Inventor: David Dent, Portland, OR (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/409,978

(22) Filed: Sep. 30, 1999

(65) Prior Publication Data

US 2002/0012239 A1 Jan. 31, 2002

(51) Int. Cl.[7] .............................. H01R 12/16
(52) U.S. Cl. ................. 361/785; 361/803; 361/792; 361/751; 361/736; 361/743; 361/749; 361/777; 361/784
(58) Field of Search ................. 361/785, 814, 361/803, 796, 751, 388, 777, 736, 778, 784, 792, 743, 789, 748–749; 324/755; 174/35 C, 261, 255

(56) References Cited

U.S. PATENT DOCUMENTS

| | | | |
|---|---|---|---|
| 4,689,721 A | | 8/1987 | Damerow et al. |
| 5,136,122 A | * | 8/1992 | Kwitkowski et al. ..... 174/94 R |
| 5,170,328 A | * | 12/1992 | Kruppa ........................ 361/398 |
| 5,521,794 A | * | 5/1996 | Hargrave et al. ............ 361/814 |
| 5,523,695 A | * | 6/1996 | Lin ............................... 324/755 |
| 5,527,998 A | | 6/1996 | Anderson et al. |
| 5,558,522 A | | 9/1996 | Dent |
| 5,667,388 A | | 9/1997 | Cottrell |
| 5,742,484 A | * | 4/1998 | Gillette et al. ............... 361/789 |
| 5,764,497 A | * | 6/1998 | Mizumo ....................... 361/803 |
| 5,917,149 A | * | 6/1999 | Barcley et al. ........... 174/35 C |
| 6,094,359 A | * | 7/2000 | Avramis et al. ............. 361/796 |

OTHER PUBLICATIONS

Flip Chip On Printed Circuit Board (FCOB) With Anisotropic Conductive Film, J.H. Lau, Proceedings of the Technical Program NEPCON West, Abstract (1998).

Electrically Conductive Adhesives: An Assessment, K. Feldmann and R. Luchs, Surface Mount Technology, Abstract (May 1998).

Experimental Variables Effecting Chain Growth in Conductive Adhesives, R.E. Hefner and M.A. Palmer, Electronic Packaging Materials Science IX Symposium, Abstract (1997).

Ground And Power Planes For Impedance–Control And EMI Shielding In PCBs Made From Conductive TLPS Pastes, L. Brandt, S. Fu, P. Gandhi, and S.M. Wentworth, Proceedings of the Technical Conference IP Printed Circuits EXPO, Abstract (1997).

(List continued on next page.)

Primary Examiner—David Martin
Assistant Examiner—Thanh Y. Tran
(74) Attorney, Agent, or Firm—Blakely, Sokoloff, Taylor & Zafman LLP

(57) ABSTRACT

A first printed circuit board has a contact area, and a second printed circuit board has a contact area. An electrically conductive band is to couple the contact area of the first printed circuit board to the contact area of the second printed circuit board. The conductive band may be selected from the group consisting essentially of a band formed from solder, a band coupled by a weld, a band coupled by a wire bond, a band comprising conductive adhesive, a band comprising conductive film, a band comprising conductive tape, and a band comprising conductive rope. The conductive band may couple the first printed circuit board and the second printed circuit board in a substantially coplanar position.

14 Claims, 4 Drawing Sheets

OTHER PUBLICATIONS

Potential Of Electrically Conductive Adhesives For MID–Technology, R. Luchs, MID '96 Molded Interconnect Devices 2nd International Congress, Abstract (1996).

Transient Liquid Phase Sintering Conductive Adhesives, C. Gallagher, G. Matijasevic, and M.A. Capote, SMI Surface Mount International Advanced Electronics Manufacturing Technologies Proceedings of the Technical Program, Abstract (1995).

Dealing With The Issues Of Lead Solder Replacements, J. Guy, Proceedings Of The Technical Program NEPCON West, Abstract (1995).

Z–Axis Conductive Adhesives As Solder Replacement, K. Chung, T. Devereaux, C. Monti, and M. Yan, 7th International SAMPE Electronics Conference: Critical Materials and Processes in a Changing World, Abstract (1994).

Organic Solders Take On New Shapes, K. Gilleo, 7th International SAMPE Electronics Conference: Critical Materials and Processes in a Changing World, Abstract (1994).

Electrical, Structural and Processing Properties of Electrically Conductive Adhesives, L. Li, C. Lizzul, H. Kim, I. Sacolick, and J.E. Morris, IEEE Transactions on Components, Hybrids, and Manufacturing Technology, Abstract (Dec. 1993).

Thermal Effects of Replacing Solder With Conductive Adhesives, O. Spalding, Hybrid Circuits, Abstract (May 1993).

Polymer Bonding Systems Offer Alternatives To Soldering, K. Gilleo, Electronic Packaging and Production, Abstract (Dec. 1992).

Z–Poxy As Solder Replacement For Surface Mounting Applications, K. Chung, R. Fleishma, D. Bendorovich, and Ya Min, ISHM '92 Proceedings Of the 1992 International Symposium on Microelectronics, Abstract (1992).

Polymer Thick Films: Materials and Applications, G. Castelli and G. Lovati, Proceedings of the 5th International Microelectronics Conference, Abstract (1988).

Low–Cost Direct Chip Attach: Comparison Of SMD Compatible FC Soldering With Anisotropically Conductive Adhesive FC Bonding, U. Behner, C.–P. Czaya, R. Haug, F.–D. Hauschild, H. Jiang, M. Kaloudis, S. Kotthaus, S. Kuschel, R. Schuetz, F. Schultze, C.P.O. Treutler, and W. Vogel, 2nd 1998 IEMT/IMC Symposium, Abstract (1998).

The Application Of Flip Chip Bonding Technology Using Anisotropic Conductive Film To The Mobile Communications Terminals, A. Torii, M. Takizawa, and M. Sawano, 2nd 1998 IEMT/IMC Symposium, Abstract (1998).

Polymeric Conductive Pastes As Solder Replacement For Flip–Chip Attachment, K.U. Maner, S.S. Ang, L.W. Schaper, and W.D. Brown, IEEE Transactions On Components, Packaging and Manufacturing Technology, Part B: Advanced Packaging, Abstract (Nov. 1998).

Reflowable Anisotropic Conductive Adhesives For Clipchip Packaging, T.Y. Sea, T.C. Tan, and E.K. Peh, Proceedings of the 1997 1st Electronic Packaging Technology Conference, Abstract (1997).

Low Cost Flip Chip Bumping Technologies, C.L. Wong, J. How, Proceedings of the 1997 1st Electronic Packaging Technology Conference, Abstract (1997).

Rheological Applications For Electronic Materials, J.F. Hyland, Proceedings of the Technical Program NEPCON West '98 Conference, Abstract (1998).

Flip Chip Bonding Primer, B. Potter, Circuits Assembly, Abstract (Sep. 1998).

Conductive Adhesive Bonding–In Surface Mount Technology, An Alternative to Soldering, F. Kriebel, VTE Aufbau— und Verbindungstechnik in der Elektronik, Abstract (Aug. 1998).

Flip Chips on PCBs With Anisotropic Conductive Film, J.H. Lau, Advanced Packaging, Abstract (Jul.–Aug. 1998).

Evaluation of Chip Scale Packaging Using Acoustic Micro Imaging: An Overview of Applications, Limitations And Directions For Future Developments, J.E. Semmens and L.W. Kessler, Pan Pacific Microelectronics Symposium: Proceedings of the Technical Program, Abstract (1998).

Fundamental Study On Adhesive Strength Of Electrical Conductive Adhesives, T. Inada and C.P. Wong, 4th International Symposium on Advanced Packaging Materials Processes, Properties, and Interfaces, Abstract (1998).

Surface Mount Conductive Adhesives With Superior Impact Resistance, S.A. Vons, Jr., Q.K. Tong, R. Kuder, and D. Shenfield, 4th International Symposium on Advanced Packaging Materials Processes, Properties, and Interfaces, Abstract (1998).

Alternate Safe Solvents In Hybrid Circuit Processing, A. Riso, Pan Pacific Microelectronics Symposium: Proceedings of the Technical Program, Abstract (1998).

Electrically Conductive Adhesives, J.E. Morris, Pan Pacific Microelectronics Symposium: Proceedings of the Technical Program, Abstract (1998).

Thick Film Conductors For 175 Degrees C Operation In Automotive Electronics, D. Nabatian, S. Shahbazi, O. Brown, and S. Schaller, 1997 International Symposium on Microelectronics, Abstract (1997).

Interconnect Resistance Characteristics Of Several Flip–Chip Bumping And Assembly Techniques, E. Nicewarner, 1997 International Symposium on Microelectronics, Abstract (1997).

The Characterization Of Enhanced, Reworkable, Thermoplastic Adhesives In Solder Replacement And Die Attach Applications, P.M. Bartholomew, M.G. Firmstone, Proceedings of ISHM–NORDIC 34th Annual Conference, Abstract (1997).

Super Fine Line Board Technology And Practical Experience Of Conductive Adhesive As Solder Replacement, B. Wikstrom, Proceedings of The 34th ISHM–Nordic Annual Conference, Abstract (1997).

The Beneficial Effect Of Underfilling On The Reliability Of Flip–Chip Joints, B. Roesner, Proceedings of the First IEEE International Symposium on Polymeric Electronics Packaging, Abstract (1997).

High Frequency Measurements And Simulations On Wire–Bonded Modules On The Sequential Build–Up Boards (SBU), R. Sihlbom, M. Dernevik, M. Lindgren, P. Starski, Z. Lai, and J. Liu, Proceedings of the First IEEE International Symposium on Polymeric Electronics Packaging, Abstract (1997).

Conductive Adhesives For High–Frequency Applications, R. Sihlbom, M. Dernevik, Z. Lai, P. Starski, and J. Liu, Proceedings of the First IEEE International Symposium on Polymeric Electronics Packaging, Abstract (1997).

Conductive Adhesive Materials For Lead Solder Replacement, K. Suzuki, O. Suzuki, and M. Komagata, Proceedings of the First IEEE International Symposium on Polymeric Electronics Packaging, Abstract (1997).

Evaluation Of Alternatives To Lead Solders For Printed Wiring Assemblies, J.F. Maguire, Design and Reliability of Solders and Solder Interconnections, Abstract (1997).

Analysis And Characterization Of Electrically Conductive Adhesives, M.A. Gaynes, L.J. Matienzo, J.A. Zimmerman, and D. Vanhart, Electronic Packaging Materials Science IX Symposium, Abstract (1997).

Conductive Adhesive For Surface Mount Devices, Y. Iwasa, Electronic Packaging and Production, Abstract (Nov. 1997).

Through–Hole Fabrication, M. Edson, Printed Circuit Fabrication, Abstract (Dec. 1997).

Reliability Of Large Conductive Polymer Flip Chip Assemblies For Multichip Modules (MCMs), L. Schaper, K. Maner, and S. Ang, Proceedings of the 1997 International Conference on Multichip Modules, Abstract (1997).

The Use Of PTF Inks In Jumper Wire Applications, H.S. Lee, Circuits Assembly, Abstract (Jun. 1997).

Processing With Polymer Solders, S. Corbett and M.J. Domiano, Surface Mount Technology, Abstract (Jun. 1997).

Molded Interconnect Devices—Recent Developments And Future Trends, K. Feldmann, Molded Interconnect Devices 2nd International Congress, Abstract (1996).

Conductive Adhesives: The Way Forward, K. Gilleo, Second European Surface Mount Conference Proceedings "Sharing in the Advancement of the Electronics Manufacturing Industry", Abstract (1996).

Reliability of Large Conductive Polymer Flip Chip Assemblies For Multichip Modules (MCMs), K. Maner, S. Ang, and L. Schaper, Proceedings of the 1996 International Electronics Packaging Conference, Abstract (1996).

Application And Reliability Evaluation of Solder Replacements in SMT Assembly For Satellite Electronics, D.W. Swanson, L.R. Enlow, D.E. Stiegler, and E. Timms, Proceedings of the 1996 International Symposium on Microelectronics, Abstract (1996).

Electrically Conductive Adhesives For Surface Mount Solder Replacement, M. Zwolinski, J. Hickman, H. Rubin, Y. Zaks, S. McCarthy, T. Hanlon, P. Arrowsmith, A. Chaudhuri, R. Hermansen, S. Lau, and D. Napp, Surface Mount International: Advanced Electronics Manufacturing Technologies, Abstract (1996).

Buried Jumper Technology, F. Lutschounig and R. Vodiunig, Proceedings of the Printed Circuit World Convention VII, Abstract (1996).

Fine–Line Applications Of Ormet Transient Liquid Phase Sintered Conductive Ink, P. Ganghi, Circuit World, Abstract (Oct. 1996).

Development Of Flip–Chip Joining Technology On Flexible Circuitry Using Anisotropically Conductive Adhesives and Eutectic Solder, J. Liu, K. Boustedt, and Z. Lai, Circuit World, Abstract (Jan. 1996).

Cost Effective SMT Assembly On Flexible Circuits Using Polymer Solder, P. Ferguson and P.G. Newton, Surface Mount International Conference and Exposition: Proceedings of the Technical Program, Abstract (1994).

Conductive Adhesives As A Solder Replacement For Surface Mount Assembly, H.L. Hvims, Surface Mount International Conference and Exposition: Proceedings of the Technical Program, Abstract (1994).

High Volume Electronics Manufacturing Using Conductive Adhesives For Surface Mounting, J. Liu, R. Rorgren, and L. Ljungkrona, Surface Mount International Conference and Exposition: Proceedings of the Technical Program, Abstract (1994).

Assembly With Conductive Adhesives, K. Gilleo, Surface Mount International Conference and Exposition: Proceedings of The Technical Program, Abstract (1994).

A Comparison Of Non–Conductive And Anisotropic Conductive Adhesive For Surface Mount Application, H. Kristiansen, J. Liu, and A. Bjorneklett, 10th European Microelectronics Conference Proceedings, Abstract (1995).

Bonding Flexible Circuits And Bare Chips With Anisotropic Electrically Conductive And Non–Conductive Adhesives, K. Kulojarvi, P. Savolainen, and J. Kivilahti, 10th European Microelectronics Conference Proceedings, Abstract (1995).

Are "Polymer Solders" Real? Metallurgical vs. Adhesive Joining, K. Gilleo and N. Socoloski, Proceedings of the Technical Program National Electronic Packaging and Production Conference, Abstract (1993).

Manufacturing With Conductive Adhesives, J.B. Greaves, Jr., Proceedings of the Technical Program National Electronic Packaging and Production Conference, Abstract (1993).

A Mechanical Reliability Evaluation Of Several Electrically Conductive Epoxies. I. Methodology and Basic Material Properties, A.J. Rafanelli, Structural Analysis in Microelectronic and Fiber Optic Systems 1995 ASME International Mechanical Engineering Congress and Exposition, Abstract (1995).

Implementing SMT With Conductive Adhesives, T. Cinque and K. Gilleo, SMI Surface Mount International Advanced Electronics Manufacturing Technologies Proceedings of the Technical Program, Abstract (1995).

XPS Studies Of The Interface Properties Of Conductive Adhesive/Eutectic Solder, Y.C. Koo, M.C. Jennings, R.D. Davidson, and N.S. McIntyre, Electronic Packaging Materials Science VIII Symposium, Abstract (1995).

An Investigation Of Conductive Polymer Flip Chip Attachment In Multichip Module Applications, C. Howard, S. Nair, S. Ang, and L. Schaper, 1995 Proceedings of the 45th Electronic Components and Technology Conference, Abstract (1995).

Electrical Properties Of Solder Filled Anisotropically Conductive Adhesives, P. Savolainen and J. Kivilahti, Journal of Electronics Manufacturing, Abstract (Mar. 1995).

Z–Axis Anisotropic Electrically Conducting Polymer–Matrix Composite Film, L. Li and D.D.L. Chung, 7th International SAMPE Electronics Conference: Critical Materials and Processes in a Changing World, Abstract (1994).

Evaluation Of Contact Resistance For Isotropic Electrically Conductive Adhesives, M.A. Gaynes and R.H. Lewis, 7th International SAMPE Electronics Conference: Critical Materials and Processes in a Changing World, Abstract (1994).

The Use Of Adhesive Technology In The Replacement Of Solder For The Manufacture Of The New Fiat 500 Ignition System, R. Barbieri, G. Coppari, and D. Rudland, 7th International SAMPE Electronics Conference: Critical Materials and Processes in a Changing World, Abstract (1994).

Conductive Polymer Composites As A Replacement For Conventional Lead Based Solders, H.S. Katz and R. Agarwal, 7th International SAMPE Electronics Conference: Critical Materials and Processes in a Changing World, Abstract (1994).

The Use Of Adhesive Technology In The Replacement Of Solder For The Manufacture Of The New Fiat 500 Ignition System, R. Barbieri, G. Coppari, and D. Rutland, Conference Proceedings Combined Volumes: Electro/94 International, Abstract (1994).

Polymer Flip Chip P/Sub F/C: A Technology Assessment Of Solderless Bump Processes And Reliability, R. Estes, Proceedings of International Conference on Electronics Technologies, Abstract (1994).

Proceedings Of The 16th IEEE/CPMT International Electronic Manufacturing Technology Symposium, Abstract (1994).

NCMS Lead Elimination Programs For The Electronic Interconnect Industry, Napp, D., Processing of Advanced Materials, Abstract (Dec. 1994).

Manufacturing 25 mil Pitch Surface Mount Assemblies Using Conductive Adhesives, J. Guy, Proceedings of Printed Circuits and Electronic Assemblies, Abstract (1994).

Comparative Study Of Stencil Performance For Fine Pitch And Ultra Fine Pitch Printing, G.T. Marks and R.S. Clouthier, Proceedings of Printed Circuits and Electronic Assemblies, Abstract (1994).

Are Polymer Solders The Answer To Lead–Free Assembly?, K. Gilleo, Surface Mount Technology, Abstract (Jan. 1995).

An Environmental Comparison Of Solder And Conductive Adhesives For SMT Interconnect, P.P. Conway, Proceedings of 15th IEEE/CHMT International Electronic Manufacturing Technology Symposium, Abstract (1993).

* cited by examiner

BOARD-TO-BOARD ELECTRICAL COUPLING WITH CONDUCTIVE BAND

BACKGROUND OF THE INVENTION

1. Field of the Invention

The present invention relates generally to the field of packaging of electrical components. More particularly, the present invention relates to the field of electrically coupling printed circuit boards.

2. Description of Related Art

Mechanical connectors, such as friction-fit card edge connectors or pin-in-socket connectors for example, are typically used for electrically interconnecting printed circuit boards. Such connectors, however, are disadvantageous as each board must typically be configured with a respective correlating male or female connector. The ability to interconnect one board with another depends, then, on the type of connector on each board. Also, such connectors typically require some forced mechanical contact and are therefore inherently less reliable. To ensure proper alignment, each line or pin connection for such connectors typically requires a minimum width and spacing. Forced mechanical connections using long traces, dissimilar metals, and/or angular geometries, for example, also compromise the quality of the signal transferred and produce greater electromagnetic interference emissions. Typical mechanical connectors also consume relatively more space on printed circuit boards.

BRIEF SUMMARY OF THE INVENTION

A first printed circuit board has a contact area, and a second printed circuit board has a contact area. An electrically conductive band is to couple the contact area of the first printed circuit board to the contact area of the second printed circuit board. The conductive band may be selected from the group consisting essentially of a band formed from solder, a band coupled by a weld, a band coupled by a wire bond, a band comprising conductive adhesive, a band comprising conductive film, a band comprising conductive tape, and a band comprising conductive rope. The conductive band may couple the first printed circuit board and the second printed circuit board in a substantially coplanar position.

BRIEF DESCRIPTION OF THE DRAWINGS

The present invention is illustrated by way of example and not limitation in the figures of the accompanying drawings, in which like references indicate similar elements and in which.

DETAILED DESCRIPTION

The following detailed description sets forth an embodiment or embodiments in accordance with the present invention for board-to-board electrical coupling with conductive band. In the following description, details are set forth such as specific materials, printed circuit boards, etc., in order to provide a thorough understanding of the present invention. It will be evident, however, that the present invention may be practiced without these details. In other instances, well-known techniques, etc., have not been described in particular detail so as not to obscure the present invention.

In accordance with the present invention, printed circuit boards are electrically coupled with one or more conductive bands. Any suitable printed circuit boards may be electrically coupled with one or more conductive bands in any suitable manner.

Figure 1:
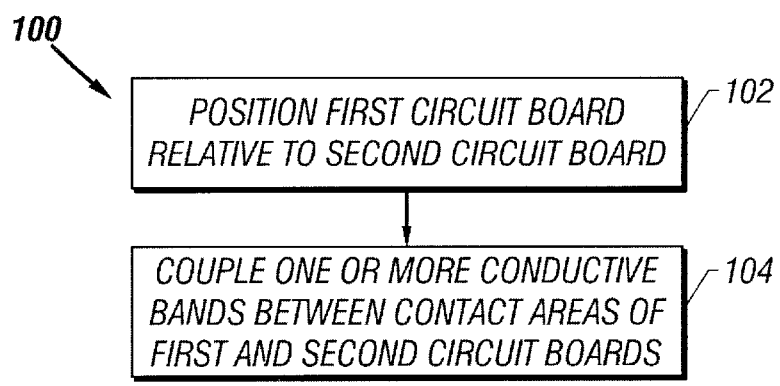
FIG. 1 illustrates, for one embodiment, a method for electrically coupling printed circuit boards with a conductive band.
Figure 2:
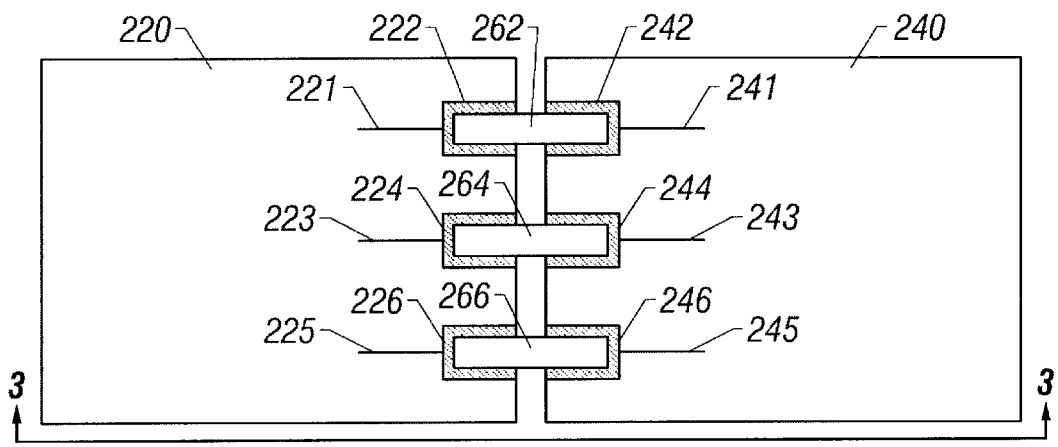
FIG. 2 illustrates, for one embodiment, a top view of two substantially coplanar printed circuit boards electrically coupled with conductive bands.
Figure 3:
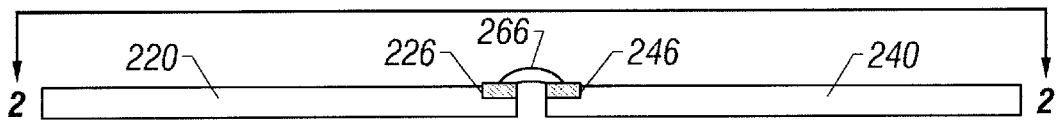
FIG. 3 illustrates a side view of the coupled printed circuit boards of FIG. 2.

For one embodiment, two printed circuit boards may be electrically coupled with one or more conductive bands in accordance with flow diagram 100 of FIG. 1 and with reference to FIGS. 2 and 3, for example.

A first printed circuit board 220 is positioned 102 relative to a second printed circuit board 240. First printed circuit board 220 comprises one or more contact areas for electrical coupling to one or more contact areas of second printed circuit board 240. As illustrated in FIGS. 2 and 3, first printed circuit board 220 comprises, for example, bonding pads 222, 224, and 226 deposited over traces 221, 223, and 225, respectively, and second printed circuit board 240 comprises, for example, bonding pads 242, 244, and 246 deposited over traces 241, 243, and 245, respectively. In positioning first printed circuit board 220 and second printed circuit board 240, contact areas of first and second printed circuit boards 220 and 240 are aligned for electrical coupling with one or more conductive bands. As illustrated in FIG. 2, bonding pads 222 and 242 are aligned; bonding pads 224 and 244 are aligned; and bonding pads 226 and 246 are aligned.

A conductive band is coupled 104 between contact areas of first and second printed circuit boards 220 and 240. As illustrated in FIGS. 2 and 3, a conductive band 262 is coupled between bonding pads 222 and 242; a conductive band 264 is coupled between bonding pads 224 and 244; and a conductive band 266 is coupled between bonding pads 226 and 246.

Each conductive band may comprise any suitable material and may be coupled between contact areas in any suitable manner. For one embodiment, as illustrated in FIGS. 2 and 3, each conductive band may comprise a suitable solder and may be coupled between contact areas, for example, while first and second printed circuit boards 220 and 240 are delivered through a wave solder. Tin lead solder or silver solder, for example, may be used. For other embodiments, each conductive band may comprise any suitable material and may be coupled between contact areas using a suitable cold formed weld technique, a suitable pin point spot weld technique, or a suitable wire bonding technique, for example.

For still other embodiments, each conductive band may also comprise, for example, suitable conductive glue or adhesive, suitable conductive film, suitable conductive tape, or suitable conductive rope. Conductive glue or adhesive defines one or more conductive paths using a suitable material of a suitable shape within a suitable glue or adhesive material. The glue or adhesive may be used to couple the conductive band to a contact area. One exemplary conductive adhesive is an anisotropic epoxy. Conductive film defines one or more conductive paths between opposite surfaces of the film using a suitable material of a suitable shape. The film may be coupled to a contact area, for example, by using mechanical pressure or by using a suitable adhesive conductive film such as those manufactured by Minnesota Mining and Manufacturing (3M) Company under product numbers 5303 and 7303. Conductive tape defines one or more conductive paths along the length or width of the tape using a suitable material of a suitable shape. The conductive paths may be at least partially exposed in an adhesive portion on one side of the tape for coupling to a contact area. A conductive rope defines one or more conductive paths along the length of the rope using a suitable material of a suitable shape within a suitable rope-like or string-like material or within any other suitable material. A suitable conductive path for a conductive rope may be defined, for example, by a plurality of conductive disks stacked on top of one another. The rope may be coupled to a contact area using, for example, mechanical pressure.

Compared to the use of typical mechanical connectors, electrical coupling of printed circuit boards with one or more conductive bands helps provide a more reliable electrical coupling and a relatively lower coupling impedance where forced mechanical contact is avoided. Also, conductive bands consume less space than typical mechanical connectors and are therefore particularly beneficial in manufacturing portable laptop or notebook computers. Use of conductive bands further allows printed circuit boards to be designed with relatively finer contact area widths and spacings and therefore a higher contact area density.

As illustrated in FIGS. 2 and 3, electrically coupling first and second printed circuit boards 220 and 240 with one or more conductive bands allows first and second printed circuit boards 220 and 240 to be electrically coupled while positioned in a substantially coplanar relationship with respect to one another. As each conductive band is substantially coplanar with first and second printed circuit boards 220 and 240, each conductive band essentially forms a substantially coplanar electrical coupling or interconnect for first and second printed circuit boards 220 and 240. Coupling first and second printed circuit boards 220 and 240 in this manner effectively creates a single, planar board and advantageously allows both boards to be mounted, for example, to the same chassis within a computer system for stability and thermal dissipation. As the plane of both first and second printed circuit boards 220 and 240 as well as conductive bands 262, 264, and 266 lie in substantially the same x-y plane, coupling first and second printed circuit boards 220 and 240 in this manner may prove particularly beneficial in manufacturing portable laptop or notebook computers. For one embodiment, a suitable stiffening support, such as a stiffening bar for example, may be coupled to both first and second printed circuit boards 220 and 240 to help provide mechanical support for first and second printed circuit boards 220 and 240 when electrically coupled by one or more conductive bands. Compared to the use of typical mechanical connectors, electrical coupling of printed circuit boards with one or more conductive bands decouples the electrical and mechanical requirements for board-to-board couplings.

Figure 4:
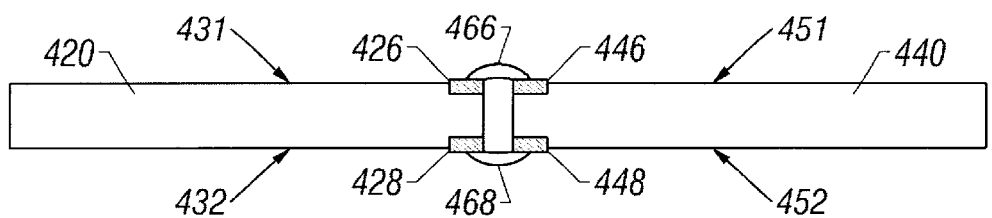
FIG. 4 illustrates, for one embodiment, a side view of two substantially coplanar printed circuit boards electrically coupled with conductive bands on opposite sides of each board.

Conductive bands may also be used to electrically couple contact areas on opposite sides of printed circuit boards. As illustrated in FIG. 4, a conductive band 466 is coupled between a bonding pad 426 on a first side 431 of a first printed circuit board 420 and a bonding pad 446 on a first side 451 of a second printed circuit board 440. Also, a conductive band 468 is coupled between a bonding pad 428 on a second side 432 of first printed circuit board 420 and a bonding pad 448 on a second side 452 of second printed circuit board 440. Providing a two-sided electrical coupling in this manner advantageously allows for more electrical connections to be made between first and second printed circuit boards 420 and 440, allowing for more communication between first and second printed circuit boards 420 and 440.

Figure 5:
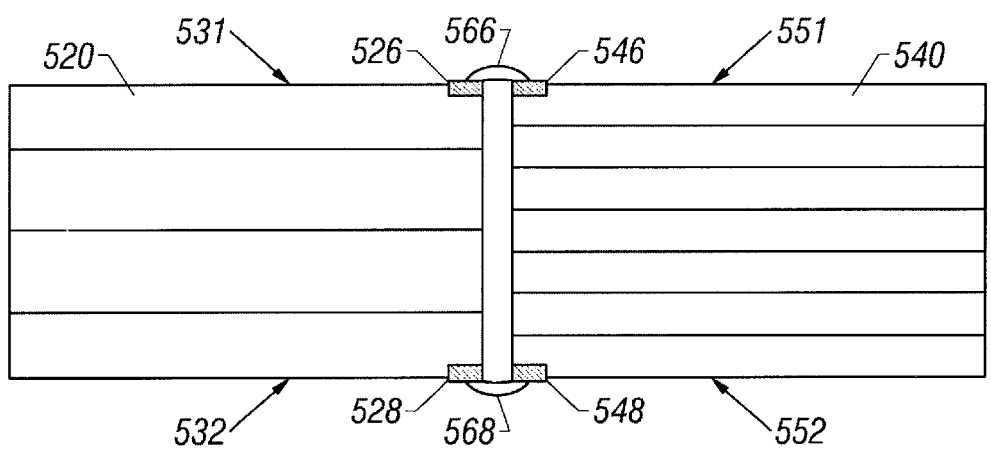
FIG. 5 illustrates, for one embodiment, a side view of two substantially coplanar printed circuit boards of different layer counts electrically coupled with conductive bands.

Printed circuit boards having different layer counts may also be electrically coupled with conductive bands on only a single side of the printed circuit boards or, alternatively, on opposite sides of the printed circuit boards. As illustrated in FIG. 5, a conductive band 566 is coupled between a bonding pad 526 on a first side 531 of a first printed circuit board 520 having four layers and a bonding pad 546 on a first side 551 of a second printed circuit board 540 having seven layers. A conductive band 568 may also be coupled between a bonding pad 528 on a second side 532 of first printed circuit board 520 and a bonding pad 548 on a second side 552 of second printed circuit board 540 to establish a two-sided electrical coupling. For two-sided electrical couplings, the thickness of the layers of each printed circuit board may be altered as necessary to alter the overall thickness of each printed circuit board and help align traces for electrical coupling.

Although the printed circuit boards illustrated in FIGS. 2, 3, 4, and 5 are positioned in a substantially coplanar relationship, printed circuit boards may be electrically coupled with one or more conductive bands in any suitable position, including a suitable non-coplanar position.

Figure 6:
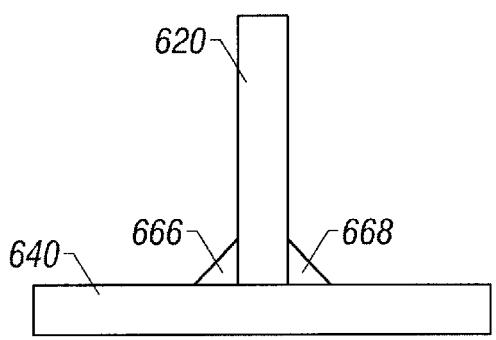
FIG. 6 illustrates, for one embodiment, two substantially perpendicular printed circuit boards electrically coupled with a conductive band.
Figure 7:
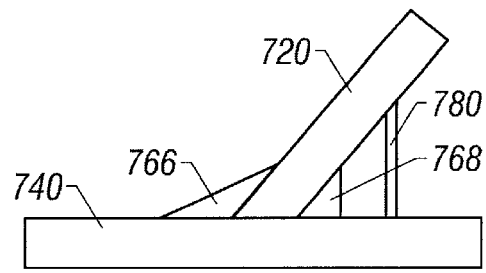
FIG. 7 illustrates, for one embodiment, two non-coplanar printed circuit boards electrically coupled with a conductive band.

As illustrated in FIG. 6, a first printed circuit board 620 may be positioned in a substantially perpendicular relationship relative to a second printed circuit board 640. Contact areas of first and second printed circuit boards 620 and 640 may be electrically coupled with conductive bands 666 and 668, for example. Similarly, a first printed circuit board 720 may be positioned at a suitable angle greater than zero degrees and less than 90 degrees relative to a second printed circuit board 740, as illustrated in FIG. 7. Contact areas of first and second printed circuit boards 720 and 740 may be electrically coupled with conductive bands 766 and 768, for example. For one embodiment, a support 780 is coupled between printed circuit boards 720 and 740 to support first printed circuit board 720. Support 780 provides stability despite vibration or other mechanical shock. Support 780 may be coupled between printed circuit boards 720 and 740 in any suitable manner, such as by soldering for example.

Figure 8:
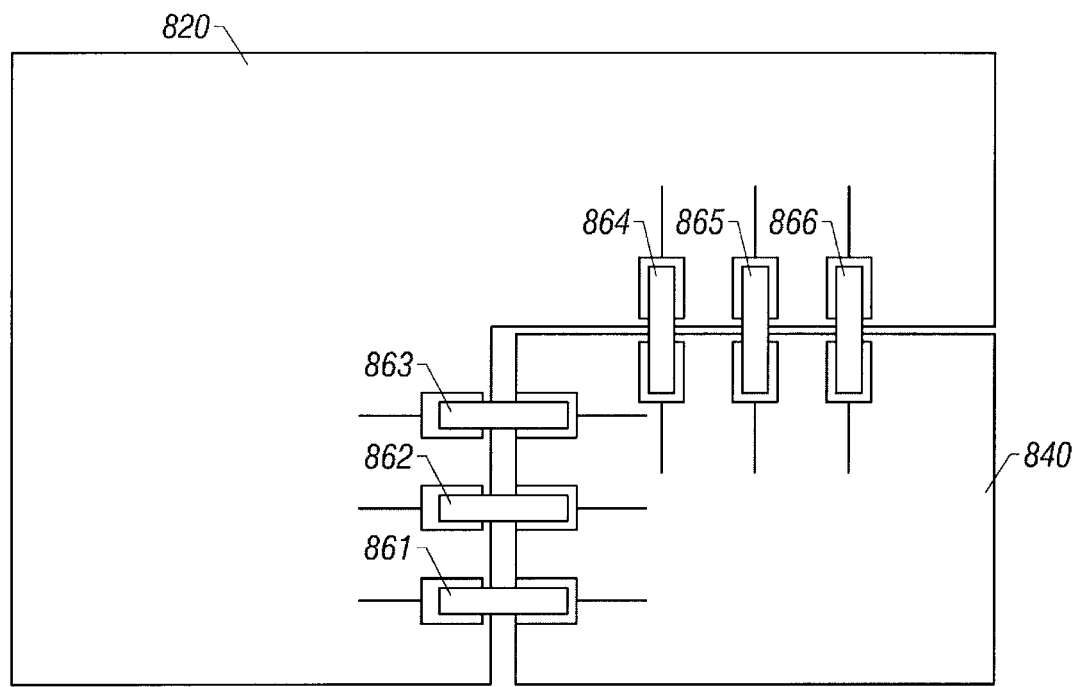
FIG. 8 illustrates, for one embodiment, an L-shaped mother printed circuit board electrically coupled to a daughter printed circuit board with conductive bands.

Electrically coupling printed circuit boards with one or more conductive bands helps in the production of configurable boards for computer systems. As one example, as illustrated in FIG. 8, an L-shaped mother printed circuit board 820 may be electrically coupled to a suitable daughter printed circuit board 840 with conductive bands 861, 862, 863, 864, 865, and 866, for example, to produce an effectively single, planar board. Daughter printed circuit board 840 may be any suitable printed circuit board, such as a processor board, a memory board, or a communications board, such as a modem card or a local area network card for example. Electrically coupling printed circuit boards with one or more conductive bands allows for the manufacture of a variety of mother printed circuit boards and daughter printed circuit boards without concern for the type of mechanical connector required for electrical coupling of any one printed circuit board with another in producing configurable boards. Where solder is used for each conductive band, an effectively single, planar printed circuit board may be manufactured as the mother and daughter printed circuit boards are delivered through a wave solder.

Figure 9:
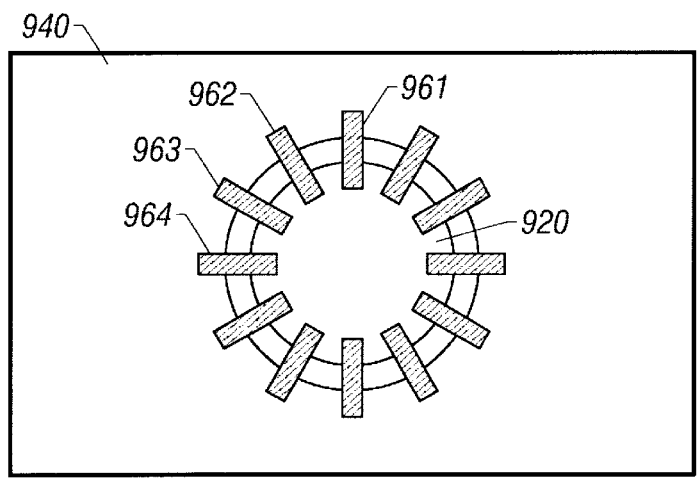
FIG. 9 illustrates, for one embodiment, two printed circuit boards electrically coupled with conductive bands with one printed circuit board residing in an opening of the other printed circuit board.

A variety of differently shaped printed circuit boards may be electrically coupled with one or more conductive bands. As one example, as illustrated in FIG. 9, a circular printed circuit board 920 may be positioned in an accommodating opening of another printed circuit board 940 and electrically coupled to printed circuit board 940 with conductive bands 961, 962, 963, and 964, for example. Aside from circles, other suitable shapes such as ovals, triangles, stars, squares, etc. may also be considered for printed circuit board 920 and for the opening of printed circuit board 940.

Figure 10:
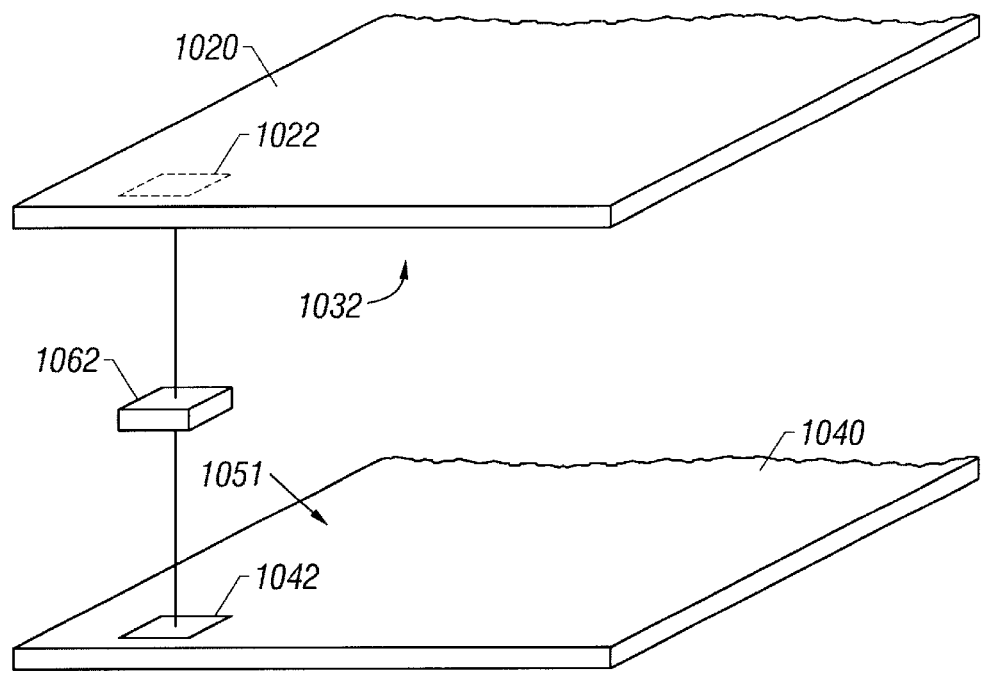
FIG. 10 illustrates, for one embodiment, two printed circuit boards electrically coupled with a conductive band with at least a portion of one printed circuit board over at least a portion of the other printed circuit board.

At least a portion of each printed circuit board may also be positioned over one another and electrically coupled with one or more conductive bands. As illustrated in FIG. 10, at least a portion of first printed circuit board 1020 may be positioned over at least a portion of second printed circuit board 1040. A contact area 1022 on one side 1032 of first printed circuit board may be electrically coupled to a contact area 1042 on one side 1051 of second printed circuit board 1040 with a conductive band 1062. Conductive band 1062 may comprise any suitable material and may be coupled to contact areas 1022 and 1042 in any suitable manner. For one embodiment, conductive band 1062 comprises a suitable solder. For other embodiments, each conductive band may comprise any suitable material and may be coupled between contact areas using a suitable cold formed weld technique, a suitable pin point spot weld technique, or a suitable wire bonding technique, for example. Each conductive band may also comprise, for example, suitable conductive glue or adhesive, suitable conductive film, suitable conductive tape, or suitable conductive rope.

Figure 11:
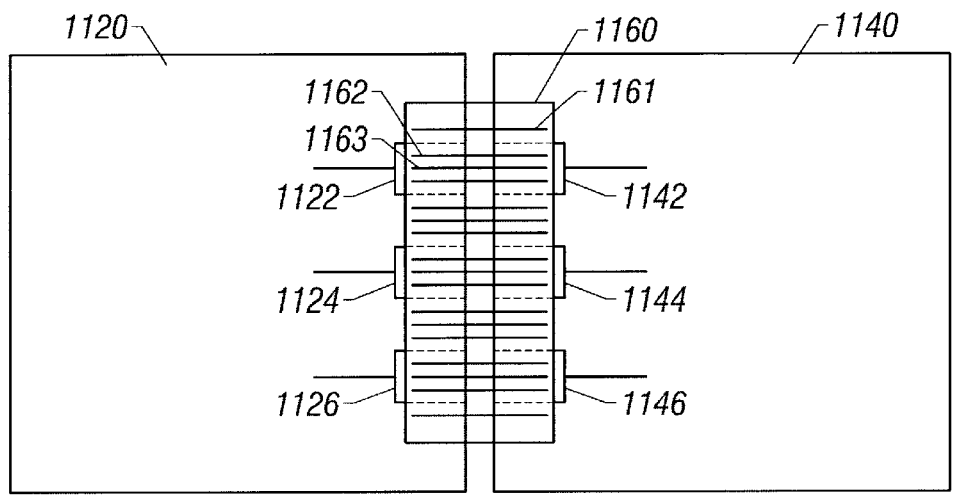
FIG. 11 illustrates, for one embodiment, a top view of two substantially coplanar printed circuit boards electrically coupled with conductive tape.

For one embodiment using conductive tape for each conductive band, a respective piece of conductive tape may be coupled between a pair of contact areas such that one or more conductive paths defined along the length or width of the tape electrically couples the pair of contact areas. For another embodiment, as illustrated in FIG. 11, a single piece of conductive tape 1160 defining a plurality of conductive paths 1161, 1162, and 1163, for example, across the width of tape 1160 may be coupled between a plurality of contact areas 1122, 1124, and 1126 on a first printed circuit board 1120 and a plurality of contact areas 1142, 1144, and 1146 on a second printed circuit board 1140, respectively. As the conductive paths of tape 1160 run only along the width of tape 1160 between first and second printed circuit boards 1120 and 1140, tape 1160 may be placed over a plurality of contact areas on the same board without shorting any two contact areas on the same board. Tape 1160 may define only one or more than one conductive path per contact area coupling. Defining relatively more conductive paths per contact area coupling allows tape 1160 to be placed over contact areas 1122, 1124, 1126, 1142, 1144, and 1146 with reduced concern for alignment of conductive paths between contact areas.

In the foregoing description, the invention has been described with reference to specific exemplary embodiments thereof. It will, however, be evident that various modifications and changes may be made thereto without departing from the broader spirit or scope of the present invention as defined in the appended claims. The specification and drawings are, accordingly, to be regarded in an illustrative rather than a restrictive sense.

What is claimed is:

1. An apparatus comprising:
    a first printed circuit board having a contact area;
    a second printed circuit board having a contact area, the second printed circuit board disposed in a substantially coplanar position with the first printed circuit board; and
    an electrically conductive band to couple the contact area of the first printed circuit board to the contact area of the second printed circuit board, wherein the conductive band comprising a band formed from solder that extends from the contact area of the first printed circuit board to the contact area of the second printed circuit board.

2. The apparatus of claim 1, wherein the band formed from solder comprises tin lead solder or silver solder.

3. The apparatus of claim 1, wherein the conductive band is to couple contact areas on one side of the first and second printed circuit boards, the apparatus comprising another conductive band to couple contact areas on another side of the first and second printed circuit boards.

4. The apparatus of claim 3, wherein the first and second printed circuit boards each comprise a different number of layers.

5. The apparatus of claim 1, comprising a plurality of conductive bands to couple contact areas of the first and second printed circuit boards.

6. The apparatus of claim 1, wherein the first printed circuit board is a mother printed circuit board and the second printed circuit board is a daughter printed circuit board selected from the group consisting essentially of a processor board, a memory board, and a communications board.

7. The apparatus of claim 1, wherein the first printed circuit board defines an opening and the second printed circuit board resides in the opening.

8. A method comprising:
    positioning a first printed circuit board in a substantially coplanar position relative to a second printed circuit board; and
    coupling a contact area of the first printed circuit board to a contact area of the second printed circuit board with a conductive band comprising band formed from solder that extends from the contact area of the first printed circuit board to the contact area of the second printed circuit board.

9. The method of claim 8, wherein the coupling comprises coupling contact areas on one side of the first and second printed circuit boards, the method comprising coupling contact areas on another side of the first and second printed circuit boards with another conductive band.

10. The method of claim 8, comprising coupling contact areas of the first and second printed circuit boards with a plurality of conductive bands.

11. The method of claim 8, wherein the first printed circuit board is a mother board and the second printed circuit board is selected from the group consisting essentially of a processor board, a memory board, and a communications board.

12. A computer system comprising:

a mother printed circuit board;

a daughter printed circuit board selected from the group consisting essentially of a processor board, a memory board, and a communications board; and a plurality of conductive bands each to couple a contact area of the mother printed circuit board to a contact area of the daughter printed circuit board, the mother printed circuit board and the daughter printed circuit board being in a non-overlapping position relative to one another wherein at least one of the plurality of conductive bands comprises a band formed from solder extending from the contact area of the daughter printed circuit board to the contact area of the mother printed circuit board.

13. The computer system of claim 12, wherein each conductive band couples the mother printed circuit board and the daughter printed circuit board in a substantially coplanar position.

14. The computer system of claim 12, wherein each conductive band is to couple contact areas on one side of the mother printed circuit board and the daughter printed circuit board, the computer system comprising a plurality of other conductive bands each to couple contact areas on another side of the mother and daughter printed circuit boards.

* * * * *